United States Patent
Jeter et al.

(10) Patent No.: US 9,396,778 B1
(45) Date of Patent: Jul. 19, 2016

(54) CONDITIONAL MEMORY CALIBRATION CANCELLATION

(71) Applicant: Apple Inc., Cupertino, CA (US)

(72) Inventors: Robert E. Jeter, Santa Clara, CA (US); Kai Lun Hsiung, Fremont, CA (US); Rakesh L. Notani, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/820,815

(22) Filed: Aug. 7, 2015

(51) Int. Cl.
   *G11C 7/06* (2006.01)
   *G11C 7/22* (2006.01)
   *G11C 7/00* (2006.01)
   *G11C 7/10* (2006.01)

(52) U.S. Cl.
   CPC .. *G11C 7/22* (2013.01); *G11C 7/00* (2013.01); *G11C 7/1009* (2013.01); *G11C 2207/2254* (2013.01)

(58) Field of Classification Search
   CPC .......... G11C 7/00; G11C 7/22; G11C 7/1009; G11C 2207/2254
   USPC ............... 365/189.07, 191, 193, 194, 233.19, 365/233.13
   See application file for complete search history.

(56) References Cited

U.S. PATENT DOCUMENTS

| | | | |
|---|---|---|---|
| 8,037,375 B2 | 10/2011 | Schafer | |
| 8,379,457 B1 | 2/2013 | Chen | |
| 8,767,471 B2 * | 7/2014 | Chen | G06F 13/1689 365/185.18 |
| 9,213,359 B2 * | 12/2015 | Prakash | G06F 1/12 |
| 2014/0307514 A1 | 10/2014 | Prakash et al. | |
| 2015/0145581 A1 | 5/2015 | Palmer et al. | |

* cited by examiner

*Primary Examiner* — Gene Auduong
(74) *Attorney, Agent, or Firm* — Meyertons, Hood, Kivlin & Goetzel, P.C.; Erik A. Heter

(57) ABSTRACT

A method and apparatus for conditional cancellation of a calibration procedure is performed. In one embodiment, a memory controller is coupled to memory. The memory controller is configured to convey data and a data strobe signal to the memory. The memory controller may conduct calibrations of a delay of the data strobe signal to ensure sufficient setup and hold time for the data. After an initial calibration, and at each of a number of periodic intervals, the memory controller may determine whether one or more parameters is within a specified range. If one of the one or more parameters is not within its respective specified range, another calibration of the data strobe delay may be performed. However, if each of the one or more parameters is within its respective specified range, the calibration may be canceled.

20 Claims, 6 Drawing Sheets

CONDITIONAL MEMORY CALIBRATION CANCELLATION

BACKGROUND

1. Technical Field

This disclosure is directed to data transmission, and more particularly, to calibrating data transmissions to a clock signal.

2. Description of the Related Art

In many memory systems, such as various double data rate (DDR) systems, a clock signal known as a data strobe is transmitted along with data. Data received at, e.g., the memory, may be synchronized to the data strobe.

As clock speeds increase, inherent delays between the data strobe and the data may become problematic. Such delays may be exacerbated by voltage and temperature variations. In some cases, memory manufacturers may match internal delays between the data strobe and data signals as a method of compensation. In other cases, calibrations may be periodically performed to align the data strobe to the data signals.

SUMMARY

A method and apparatus for conditional cancellation of a calibration procedure is performed. In one embodiment, a memory controller is coupled to memory. The memory controller is configured to convey data and a data strobe signal to the memory. The memory controller may conduct calibrations of a delay of the data strobe signal to ensure sufficient setup and hold time for the data. After an initial calibration, and at each of a number of periodic intervals, the memory controller may determine whether each of one or more parameters is within a respective specified range. If at least one of the one or more parameters is not within its respective specified range, another calibration of the data strobe delay may be performed. However, if each of the one or more parameters is within its respective specified range, the calibration may be canceled.

In one embodiment, one or more scaling factors may be used to indicate changes to the one or more parameters. For example a first scaling factor may be determined within the memory controller, while a second scaling factor may be determined on the memory. The scaling factors may be indicative of current parameters of the operating environment, e.g., voltage, temperature, etc. The scaling factors may be compared to respective historical/reference values. If a comparison at a given interval indicates that the scaling factors, and thus the associated parameters, have not changed or that changes thereto fall within a specified range (e.g., ±5%), the calibration for that interval may be canceled. On the other hand, if the comparison results in at least one of the scaling factors being outside its specified range, then the calibration may be performed at that interval.

BRIEF DESCRIPTION OF THE DRAWINGS

The following detailed description makes reference to the accompanying drawings, which are now briefly described.

Figure 1:
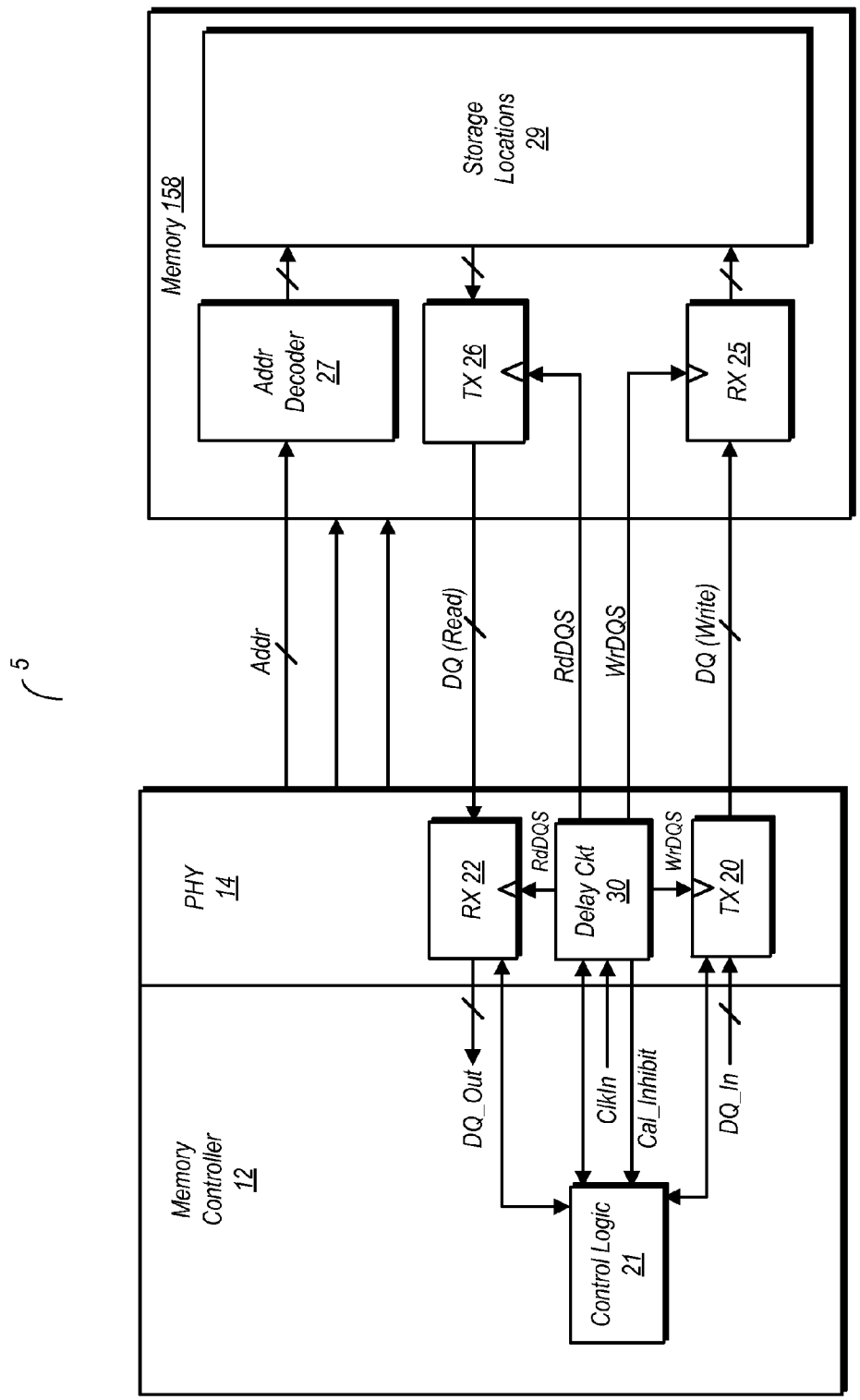
FIG. 1 is a block diagram of one embodiment of a memory subsystem.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

Turning now to FIG. 1, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver (RX) 22 configured to receive data read from memory 158, and a transmitter (TX) 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes control logic 21, which includes circuitry that may perform various functions, including conducting various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a multiple delay locked loops (DLLs), including one configured to output the read data strobe and one to output the write data strobe. In some embodiments, DLLs that output data strobe signals may be slave DLLs that receive an incoming clock signal from a corresponding master DLL. The delays of the respective DLLs may be set by various mechanisms, such as by codes programmed into the various DLLs. These codes may be determined during one or more calibration procedures that are performed to align the data strobe signals.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Various, calibration procedures may be performed at certain times during operation of memory controller 12 in order to optimize the point in time at which the data strobe signals sample data. The calibration procedures may be conducted under the control of control logic 21, and involved performing a number of reads of from memory along with adjustments of an amount of delay applied to the data strobe signal being calibrated. Various embodiments of calibration procedures are now discussed in further detail.

Different calibration procedures may be performed at different intervals. For example, one calibration procedure may be performed at a first periodicity to determine a delay to be applied to a DLL. This is the main calibration to be performed, i.e. the calibration used to align the data strobe signal (e.g., the WrDQS signal in this case) with data conveyed to the memory. In one embodiment, checks may be performed at each of a number of periodic intervals to determine if this calibration is to be performed. In particular, at each of the periodic intervals, checks may be performed to determine if one or more parameters are within a specified range. Such parameters may include voltage and temperature values. While in some embodiments, these values may be directly measured, in other embodiments these values may instead by reflected by one or more scaling factors determined in other calibrations (discussed below). These scaling factors may be compared to historical/reference values at each of the periodic intervals, and a determination may be made as to whether they are within a specified range. For example, a scaling factor may be compared to a reference value to determine whether it is within a range of ±10%. If each of the scaling factors used for comparison purposes is within the specified range, then the calibration for that particular interval may be canceled. In the embodiment shown, delay circuit 30 is configured to assert calibration inhibit signal ('Cal_Inhibit') responsive to determining that each scaling factor used for comparison is within specified limits. The calibration inhibit signal may be received by the control logic 21, which may then cancel the calibration for that interval.

If any of the scaling factors used for the comparison purposes is outside of the specified range, the calibration may be performed for that particular interval. The calibration may be performed under control of control logic 21, and may include a number of writes of data to memory followed by reads thereof to ensure that the data was properly written.

The scaling factors may be indicative of various changes in the operating conditions in the memory subsystem. For example, voltage and temperature changes may be reflected in changes to the scaling factors. These values may affect the amount of delay that is needed to ensure good alignment between the data strobe and the data. Significant changes to the voltage and temperature may cause the scaling factors to fall outside of their respective specified ranges during the comparisons performed at the periodic intervals. For example, if an operating voltage is changed in response to a request to change a performance level, the delay applied to the data strobe may need to be changed correspondingly. However, if the operating voltage and temperature values remain relatively constant or within a small range of values, the delay applied to the data strobe may either require no changes or small adjustments. Thus, in the case where the changes to parameters such as operating voltage and/or temperature are small, a full calibration may not be needed at each interval. Accordingly, a determination can be made on an interval-by-interval basis as to whether the full data strobe delay calibration is to be performed, with the calibration canceled in those instances when the operating parameters have not significantly changed.

In addition to the main calibration discussed above, additional calibrations may be performed to determine the scaling factors and to make small adjustments to the delay of the data strobe signal. These calibrations may be performed at least at the periodicity of the intervals discussed above, although in many embodiments, they may be performed more frequently. These calibrations are discussed in further detail below.

It is noted that while the calibration procedures are discussed herein within the context of a memory subsystem and transfer of data between the memory and a memory controller, the disclosure is not limited as such. In contrast, various embodiments of the calibration methods discussed herein may be utilized with a number of systems in which data transfers of a number of bits are synchronized to a particular clock signal.

Figure 2:
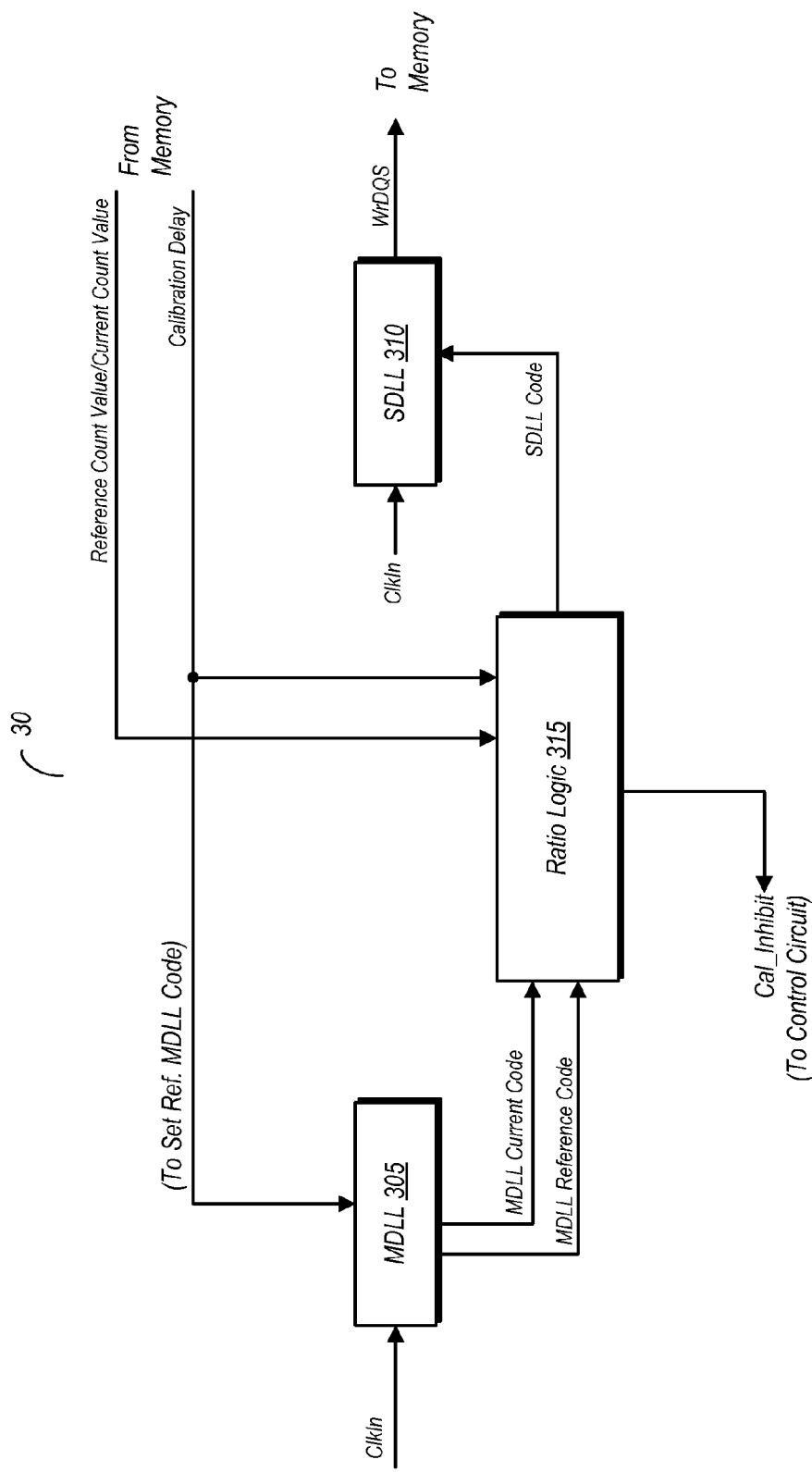
FIG. 2 is a block diagram of one embodiment of a delay circuit in a memory subsystem.

Turning now to FIG. 2, a block diagram illustrating part of one embodiment of a delay circuit is shown. In particular, the portions of delay circuit 30 illustrated here are directed to setting and maintaining a calibrated delay of the write data strobe signal, WrDQS. The illustrated portion of delay circuit 30 includes a master DLL (MDLL) 305, a slave DLL (SDLL) 310, and ratio logic 315. MDLL 305 in the embodiment shown is coupled to receive a clock signal, ClkIn, which provides the basis for the write data strobe signal. During operation, MDLL 305 acts to maintain a delay of the data strobe through adjustments to the MDLL code. Ratio logic 315, using various information, may apply the various scaling factors that are used to generate a code to program SDLL 310 in order to maintain the calibrated delay of the data strobe signal while compensating for voltage and temperature changes that may occur on both the memory controller and memory sides of the interface.

Ratio logic 315 in the embodiment shown is configured to determine the SDLL code based on a number of different pieces of information. From MDLL 305, ratio logic 315 may receive a current MDLL code and a reference MDLL code. The reference code may be updated responsive to a calibration used to determine the delay to be applied to the write data strobe signal. In between these calibrations, MDLL 305 may undergo a number of calibrations to determine a number of delay steps required to maintain the calibrated delay of the data strobe. In one embodiments, MDLL 305 may be configured to periodically perform self-calibrations to determine the number of delay steps. For example, upon a calibration of the data strobe, a self-calibration of MDLL 305 may determine that 50 delay steps are required to set the delay of the data strobe (this value is reflected in the reference MDLL code). During a subsequent self-calibration, MDLL 305 may determine that 55 delay steps are required to maintain the calibrated delay of the data strobe (i.e. a 10% increase in a number of steps). The increased value may be reflected in the current MDLL code. Both of these pieces of information may be forwarded to ratio logic 315 in order to calculate a scaling factor based on these values. Performing the periodic self-calibrations of MDLL 305 between data strobe delay calibrations may allow for the tracking of voltage and temperature changes in the memory controller as may be necessary to maintain the data strobe delay at the calibrated value.

While MDLL 305 is discussed above as being configured to perform self-calibration, the various apparatus embodiments discussed herein are not limited to the same. Embodiments in which an MDLL 305 is calibrated using other mechanisms are possible and contemplated within the spirit and scope of this disclosure.

Figure 4:
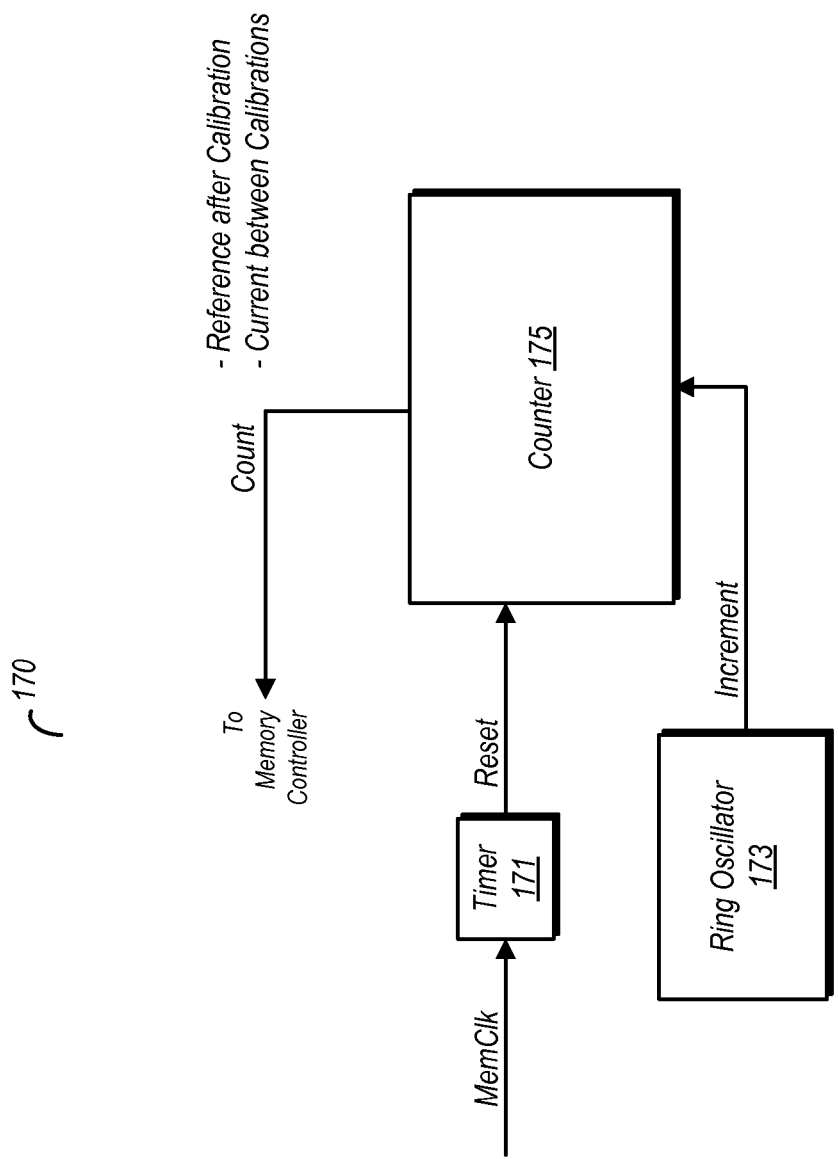
FIG. 4 is a block diagram illustrating one embodiment of a delay calibration circuit on a memory.

Voltage and temperature changes in the memory itself may be computed using a current count value and a reference count value. The count values may be received from the calibration circuit 170 on memory 158. Turning briefly to FIG. 4, one embodiment of a calibration circuit 170 is shown. As shown here, calibration circuit 170 includes a timer 171, a ring oscillator 173, and a counter 175. Timer 171 in the embodiment shown is configured to operate for a predetermined amount of time and to assert a reset signal to counter 175 after this time has elapsed. In one embodiment, the predetermined amount of time may be defined as a predetermined number of memory cycles. The predetermined number of memory cycles may in turn be defined as a predetermined number of cycles of a memory clock that is generated on the memory controller side of the interface (and may be a source clock for the data strobe signal). During the predetermined amount of time, ring oscillator 173 may cause counter 175 to increment. Counter 175 may be configured to provide temporary storage of the most recently determined count value. Upon a reset of the counter 175, the count value that was obtained during the predetermined amount of time may be forwarded to memory controller 12, and in particular to ratio logic 315.

After performing a calibration of the data strobe delay, calibration circuit 170 may conduct its own calibration to determine a reference count value that corresponds to the calibrated delay. Upon completion of the calibration procedure by calibration circuit 170, the count value obtained may be forwarded to ratio logic 315 in memory controller 12. Between calibrations of the data strobe delay, calibration circuit 170 may perform its own calibrations to determine the count value that corresponds to a particular number of cycles of the data strobe signal. The resulting count values may then be sent to the memory controller as the current count value. The reference count and the current count value may be used to determine a second scaling factor. For example, a reference count value of 500 and a current count value of 550 indicates a change of 10% (decrease in this case) of the delay as seen at the memory. This scaling factor, as determined in ratio logic, may be used to adjust the delay. Thus, while the MDLL 305 may attempt to maintain the delay at the calibrated value, using the second scaling factor determined by calibration circuit 170 may cause adjustments to the delay, between calibrations thereof, to compensate for changes that occur on the memory side of the interface. In this embodiment, these scaling factors may also be used to determine whether a full calibration of the data strobe signal, under control of control logic 21, is to be performed at each of the periodic intervals as discussed above. More particularly, if either of the scaling factors has varied from its reference value by a specified amount, or outside of a specified range at a given one of the periodic intervals, then the full calibration of the data strobe signal may be performed. Otherwise, if the scaling factors have not varied outside of the respective specified ranges at a given one of the periodic intervals, the calibration for that interval may be canceled.

Returning to FIG. 2, a calibration delay value may be provided to both ratio logic 315 and MDLL 305. As noted above, the reference code in MDLL 305 may be set responsive to performing the calibration. The calibration delay value may also be received in ratio logic 305, and may be used in determination of additional codes.

Calibration of the delay of the data strobe signal may include performing a number writes of data to and reads of data from memory controller 12 to memory 158. The data obtained from each read may be compared to expected data, with pass/fail determinations made based on the comparisons. A window of passing delay values may be determined. For example, an upper limit of the window may be an upper delay value at which all bits passed. A lower limit of the window may be a lower delay value at which all bits passed. Alternatively, upper and lower limits of the delay window may be determined based on upper and lower limits at which at least one bit passed. Irrespective of the exact methodology used to perform the data strobe delay calibration, a delay value is determined and is used to provide the basis for subsequent calibrations that occur between each instance of the data strobe delay calibrations. Namely, the delay value determined from a data strobe delay calibration is used as a basis for a reference MDLL code and a reference count value, which are used to calculate scaling factors.

Figure 3:
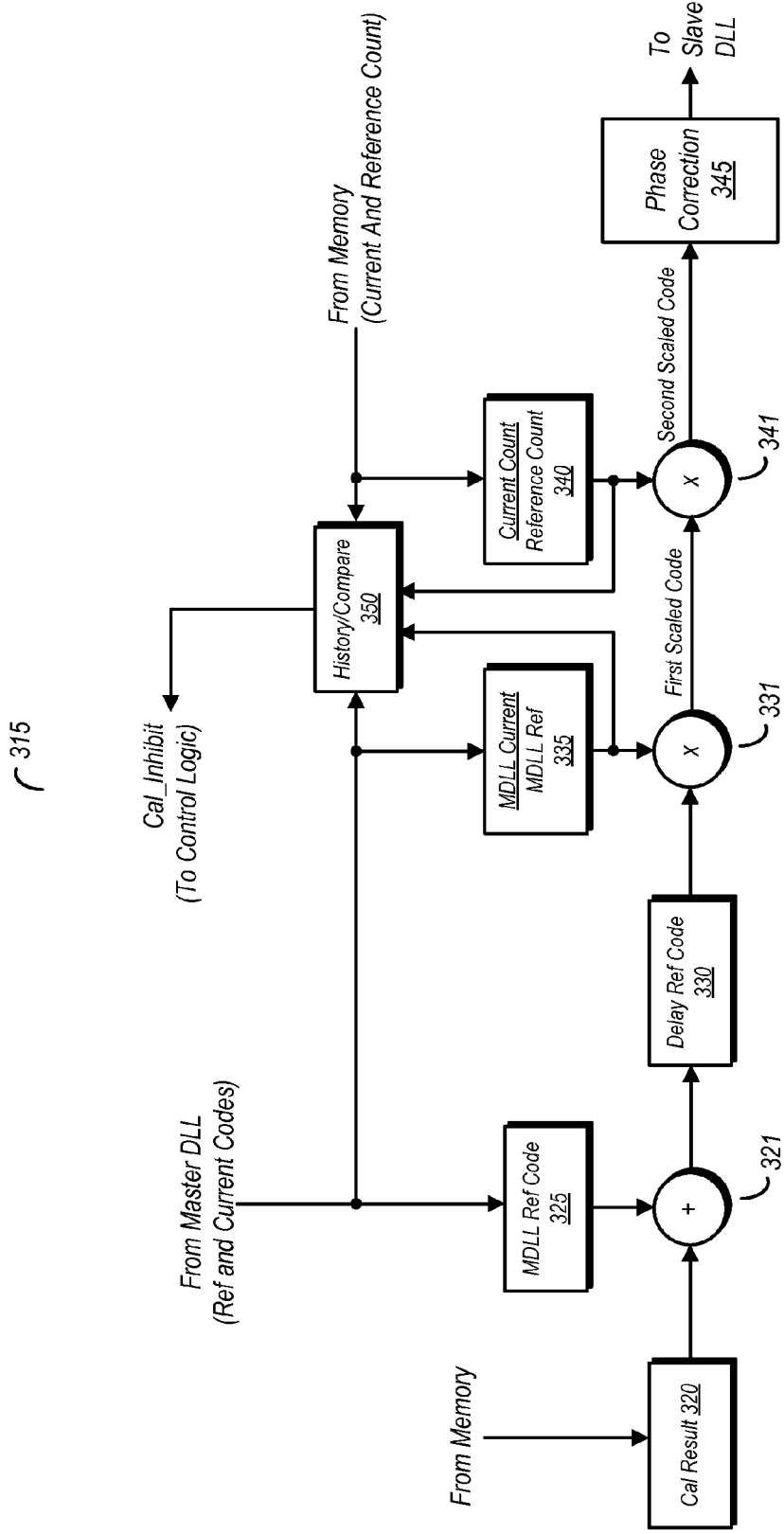
FIG. 3 is a block diagram of one embodiment of a ratio circuit.

Turning now to FIG. 3, a block diagram illustrating one embodiment of ratio logic 315. Ratio logic 315 in the embodiment shown is used to generate a code used to program SDLL 310, which is used to convey the data strobe from memory controller 12 to the memory. Two different scaling factors are generated in this embodiment, the first being based on MDLL codes, and the second being based on count values received from calibration unit 170 on memory 158. As previously noted, MDLL 305 is used in an attempt to maintain the data strobe delay at the calibrated value while adjusting for voltage and temperature changes that may occur in memory controller 12. The reference and current count values provided from calibration unit 170 on memory 158 may be used to cause adjustments to the data strobe delay responsive to changes in delay on the memory side of the interface between data strobe delay calibrations. Additionally, the values may be used at each of a number of periodic intervals, to determine if a data strobe delay calibration should be performed at a given interval or otherwise be canceled.

Upon performing a data strobe delay calibration, the determined value may be deposited in calibration result register 320. This value may be combined with the MDLL reference code by adder 321, to produce the delay reference code that is then stored in register 330. The MDLL reference code may be deposited in register 325 after MDLL 305 determines the number of delay steps just subsequent to performance of the data strobe delay calibration.

The MDLL reference code is also used in determining the first scaling factor. Subsequent to setting the MDLL reference code, additional self-calibrations of MDLL 305 occur between instances of the data strobe delay calibration. These self-calibrations of MDLL 305 are used to determine a number of delay steps to be applied in order to maintain the data strobe delay value. Each of the self-calibrations may generate a current MDLL code. Divider 335 may be used to divide the current MDLL code by MDLL reference code in order to generate a first scaling factor. The delay reference code stored in register 330 is then multiplied in multiplier 331 by the first scaling code, thereby generating a first scaled code. The first scaling factor may reflect changes in operating conditions (e.g., voltage, temperature) in memory controller 12 that could affect the delay applied to the data strobe signal.

The second scaling factor may be generated by dividing a current count value by a reference count value. Both of these values may be received from memory 158. The reference count value may be determined upon completing the data strobe delay calibration. In particular, the reference count value may correspond to the data strobe delay determined by the calibration thereof. Subsequent to determining the reference count value, additional calibrations may be performed by calibration circuit 170 to update the count value. The updated count value, referred to as the current count, is forwarded to ratio logic 315 (as is the reference count value upon its determination). The updated count value may be divided by the reference count value, in divider 340, to produce the second scaling factor. Thereafter, the second scaling factor is multiplied by the first scaled code, in multiplier 341, to produce the second scaled code.

SDLL 310 may be programmed based on the second scaled code, although further adjustments are possible in some embodiments. In the embodiment shown, phase correction circuit 345 is configured to adjust the second scaled code in order to cause a phase adjustment to the data strobe signal relative to the write data.

It is noted in the above that the first and second scaling factors are generated based on the MDLL reference code and reference count value, respectively. This is to prevent the accumulation of errors (e.g., quantization error) that might otherwise occur if only the two most recent values for each of the reference code and reference count were used. For example, if only the two most recent values of the MDLL code were used in determining the first scaling factor, any error introduces in the most recent previous MDLL code would be factored into the calculation, along with the current code. Over several iterations, this error could accumulate. Thus, by using the reference MDLL code as the basis for calculating the first scaling factor, only error introduced during the determination of the current MDLL code is factored into the calculation, and thus only the current calculation is affected. Errors that may have been present in previous non-reference values of the MDLL code are not present or factored into any calculation of the first scaling factor using only the reference MDLL code and the current MDLL code. The same applies for calculation of the second scaling factor. Since only the reference count value and the current count value are used to calculate the second scaling factor, only error introduced in determining the current count value is present in the current calculation, but is not present in any subsequent calculation.

In the embodiment shown, ratio logic also includes history/compare circuit 350. History/compare circuit 350 may store historical values for the various code/count values discussed above, and may also receive present values at each of the periodic intervals. In one embodiment, a reference MDLL code and a reference count value may be stored. Values corresponding to a range of each of the scaling factors may be generated based on the reference code/count values and also stored in history/compare circuit 350. When current values of the MDLL code and the count value are received, these values may be compared to the values defining their respective ranges. For example, if a specified range for the MDLL code is ±10% and the reference code is 500 steps, the values defining the range are 550 and 450. A current MDLL code may be compared with each of these values to determine if the MDLL code, and thus the corresponding scaling factor, is within the specified range. A corresponding operation may be performed with the count values received from memory 158.

In an alternate embodiment, history/compare circuit 350 may receive the first and second scaling factors directly from dividers 335 and 340 respectively. Ranges may be stored in history/compare circuit 350 to provide a basis for comparison to determine if the calibration is to be performed. For example, if the range is ±10%, a value greater than 1.1 or less than 0.9 may indicate that the scaling factor is out of range and thus cause history/compare circuit to hold the calibration inhibit signal de-asserted. In contrast, if the scaling factor is between 1.1 and 0.9, the calibration circuit may be asserted to cause cancellation of the calibration for the given periodic interval.

The various calibrations discussed above may be performed at various periodicities, or intervals. In one exemplary embodiment, the data strobe delay calibration may be performed at a maximum of every 100 ms. The reference MDLL code and reference count values may be updated each time the data strobe delay calibration is performed. The current MDLL code may be update at an interval of, e.g., every 100 μs, while the current count value may be updated at, e.g., every 1 ms. These values are exemplary, although generally, the current value of the MDLL code and the current count value may be multiple times between the intervals at which a determination is made regarding performance of the data strobe delay calculation.

Figure 5:
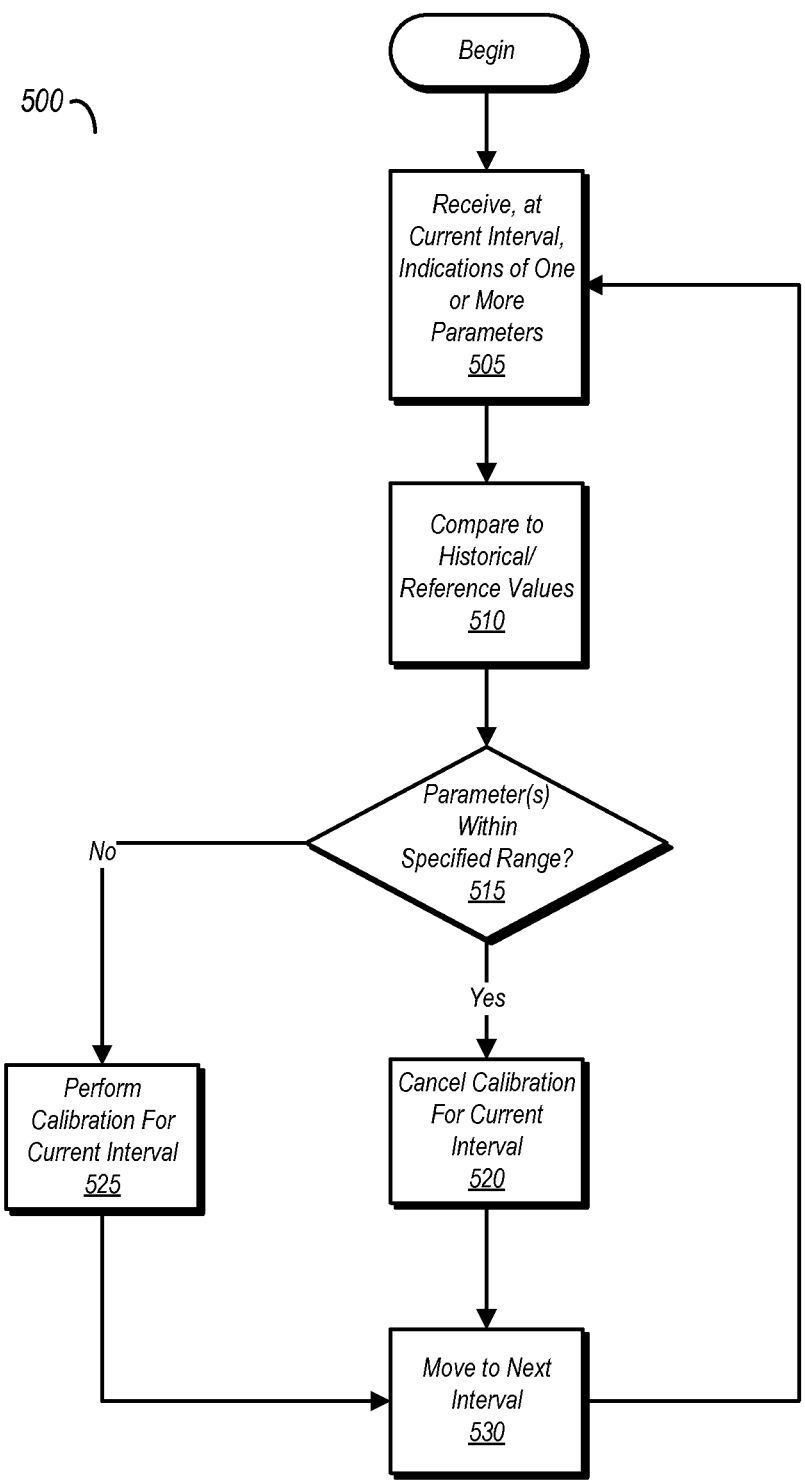
FIG. 5 is a flow diagram illustrating one embodiment of a method for determining if a data strobe delay calibration is to be performed at each of a number of periodic intervals.

Turning now to FIG. 5 a flow diagram illustrating one embodiment of a method for determining if a data strobe delay calibration is to be performed at each of a number of periodic intervals. Method 500 as shown herein may be performed using various embodiments of the hardware/circuitry discussed above. Embodiments not explicitly discussed herein that include hardware/circuitry, software, various combinations thereof that are capable of performing method 500 are also possible and contemplated and thus fall within the scope of this disclosure.

Method 500 begins receiving, at a current one of a number of periodic intervals, indications of one or more operating parameters (block 505). The operating parameters may include a current operating voltage and a current temperature. In some embodiments such as those discussed above, the values are not directly received, but are rather reflected in scaling factors, and/or values such as an MDLL code and count values received from the memory. These values may be such that they do not change significantly in the absence of significant voltage and/or temperature changes.

The received values may be compared to historical/reference values (block 510) to determine whether they are within respective specified ranges. If the values are within their respective specified ranges (block 515, yes) then the calibration of the data strobe delay may be canceled for the current interval (block 520). On the other hand, if the parameters are not within their respective specified ranges (block 515, no), then the data strobe delay calibration may be performed for the current interval (block 525). Responsive to performing the calibration, reference values may be updated. After completion of the current interval, and irrespective of whether the calibration was performed, method 500 moves to the next interval (block 530) and thus back to block 505.

In some embodiments, if a parameter is determined to be out of range between intervals, that information may be retained (e.g. by a "sticky bit") and may result in a calibration being performed at the next periodic check. Accordingly, the actions performed in blocks 505, 510, and 515 may be performed between the periodic intervals at which the calibration is performed. Furthermore, in block 515, determining whether parameters are within their specified ranges may include not only making such a determination at the periodic intervals, but also determining if the parameters have remained within their specified ranges between intervals. If it is indicated that one or more parameters were out of range at any time between the periodic checks (e.g., by determining if any sticky bits are set), then the calibration may be performed even if the parameters are within range for the most recent check. Thus, the parameter history may be incorporated into each periodic check performed at block 315.

Figure 6:
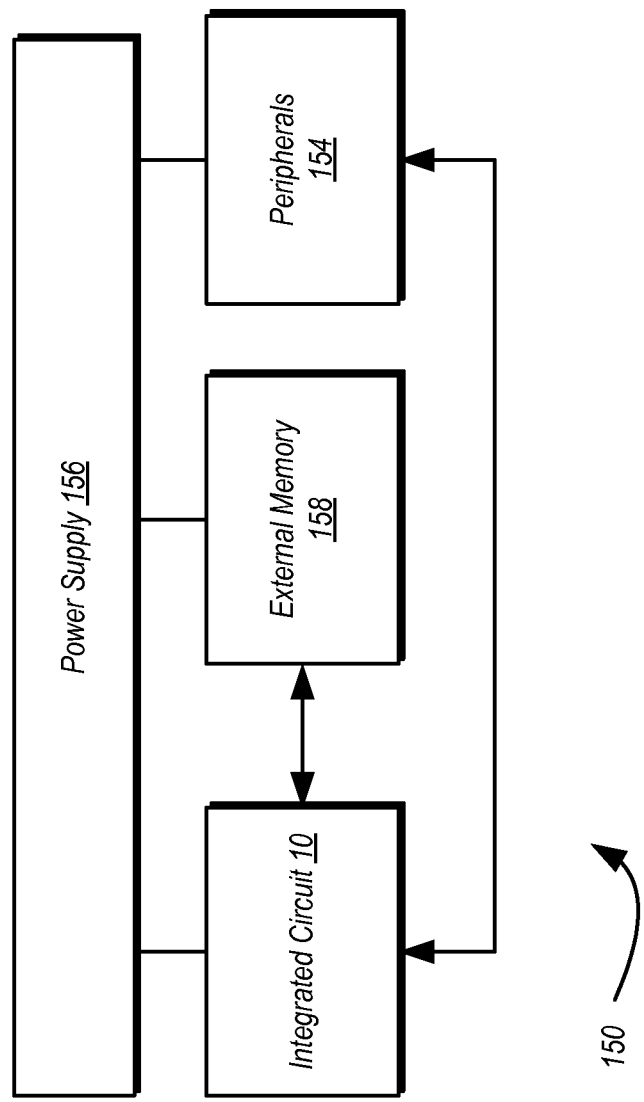
FIG. 6 is a block diagram of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

The various method and apparatus embodiments may operate more efficiently than embodiments in which calibrations are unconditionally performed at each periodic interval. As described above, calibrations are at those intervals in which one or more certain parameters are outside of their specified ranges. Accordingly, unnecessary calibrations may be eliminated. Furthermore, eliminating unnecessary calibrations may lead to increased availability of the memory subsystem, as memory is typically unavailable for normal accesses during calibrations.

Numerous variations and modifications will become apparent to those skilled in the art once the above disclosure is fully appreciated. It is intended that the following claims be interpreted to embrace all such variations and modifications.

What is claimed is:

1. A system comprising:
   a memory; and
   a memory controller coupled to send to and receive data from the memory and further configured to transmit a data strobe signal to the memory, wherein the memory controller includes a control circuit configured to cause a calibration of a delay of the data strobe signal to be performed, and a delay circuit configured to:
   determine, at each of a plurality of periodic intervals, if the calibration is to be performed responsive to determining if at least one of one or more parameters is within a respective specified range; and
   cause the calibration to be inhibited from being performed at a given one of the periodic intervals responsive to determining that each of the one or more parameters are within the respective specified range.

2. The system as recited in claim 1, wherein the delay circuit is configured to, responsive to determining that each of the one or more parameters are within the respective specified range, assert a signal to the control circuit indicating that the calibration is not to be performed at the given one of the periodic intervals.

3. The system as recited in claim 2, wherein the control circuit is configured to cause the calibration to be performed at the given one of the plurality of intervals responsive to determining that the signal is not asserted for at the given one of the plurality of intervals.

4. The system as recited in claim 1, wherein the delay circuit includes circuitry configured to determine a current value of at least one scaling factor at each of the plurality of intervals, wherein the at least one scaling factor corresponds to one of the one or more parameters, and wherein the delay circuitry further includes circuitry configured compare the current value of the at least one scaling factor to at least one previous value of the scaling factor to determine if the one of the one or more parameters is within its specified respective range.

5. The system as recited in claim 4, wherein the delay circuit includes circuitry configured to generate, at a given one of the plurality of intervals, a first scaling factor indicative of a first of the one or more parameters, and wherein the memory include circuitry configured to generate, at the given one of the plurality of intervals, a current value of a second scaling factor indicative of a second one of the one or more parameters.

6. The system as recited in claim 5, wherein the delay circuit further includes comparison circuitry coupled to receive the current values of the first and second scaling factors and configured to compare the current values of the first and second scaling factors to respective historical values of the first and second scaling factors.

7. The system as recited in claim 6, wherein the comparison circuitry is configured to cause the calibration to be canceled for the given one of the plurality of intervals if the current values of each of the first and second scaling factors are within a specified range based on their respective historical values.

8. The system as recited in claim 6, wherein the delay circuitry includes a circuit configured to generate the current value of the first scaling factor by dividing a current code for a master delay locked loop (DLL) by a reference code for the master DLL, and wherein the reference code corresponds to the most recently performed instance of the calibration.

9. The system as recited in claim 6, wherein the memory includes a circuit configured to generate the current value of the second scaling factor, the circuit including a ring oscillator configured to increment a counter over a predetermined number of memory cycles, circuitry further configured to store a current count value indicated by the counter upon completion of the predetermined number of memory cycles, and circuitry configured to calculate the current value of the second scaling factor by determining a ratio of the current count value to a reference count, the reference count being based on the delay as determined on the memory.

10. A method comprising:
determining, at each of a plurality of periodic intervals, if a calibration of a delay applied to a data strobe signal relative to data conveyed between a memory controller and a memory is to be performed;
performing the calibration at a given one of the periodic intervals responsive to determining if at least one of one or more parameters is not within a respective specified range; and
canceling the calibration at the given one of the periodic intervals responsive to determining that each of the one or more parameters are within the respective specified range.

11. The method as recited in claim 10, further comprising:
determining a current value of at least one scaling factor at each of the plurality of periodic intervals;
comparing the current value of the at least one scaling factor to at least one previous value of the scaling factor to determine if at least one parameter is within its specified respective range.

12. The method as recited in claim 11, further comprising:
generating, at a given one of the plurality of periodic intervals, a current value of a first scaling factor using scaling circuitry implemented on the memory controller;
generating, at the given one of the plurality of periodic intervals, a current value of second scaling factor using circuitry implemented on the memory;
providing the current values of the first and second scaling factors to comparison circuitry implemented on the memory controller; and
comparing, at the given one of the plurality of periodic intervals, the current values of the first and second scaling factors to respective historical values of the first and second scaling factors.

13. The method as recited in claim 12, further comprising inhibiting performance of the calibration if each of the current values of the first and second scaling factors are within a specified range based on their respective historical values.

14. The method as recited in claim 12, further comprising generating the current value of the first scaling factor by dividing a current code for a master delay locked loop (DLL) by a reference code for the master DLL, and wherein the reference code corresponds to the most recently performed instance of the calibration.

15. The method as recited in claim 12, wherein the method further comprises generating the current value of the second scaling factor using a ring oscillator and a counter on the memory, wherein generating the current value of the second scaling factor comprises:
the ring oscillator incrementing a counter over a predetermined number of memory cycles;
upon completion of the predetermined number of cycles, storing a current count value from the counter into a register; and
calculating the current value of the second scaling factor by determining a ratio of the current count value to a reference count, the reference count being based on the delay as determined on the memory.

16. The method as recited in claim 15, wherein the reference count corresponds to a count value generated during a most recent instance of the calibration.

17. The method as recited in claim 10, wherein performing the calibration comprises programming a slave DLL based on the programming a slave delay locked loop (DLL) with a reference code, wherein the slave DLL is configured to transmit the data strobe signal to the memory.

18. A method comprising:
performing, in a memory controller coupled to a memory, a first calibration of a delay applied to a data strobe signal relative to data conveyed between the memory controller and the memory;
providing, using a timer circuit, an indication that a predetermined time has elapsed since the first calibration was performed;
determining, in the memory controller, if one or more scaling factors are within a specified range responsive to receiving the indication;
performing a second calibration of the delay applied to the data strobe signal responsive to determining if any one of the one or more of the scaling factors are not within the specified range; and
canceling performance of the second calibration if each of the one or more scaling factors is within the specified range.

19. The method as recited in claim 18, further comprising:
generating, at a given one of the plurality of periodic intervals, a current value of a first scaling factor using scaling circuitry implemented on the memory controller;
generating, at the given one of the plurality of periodic intervals, a current value of second scaling factor using circuitry implemented on the memory;
providing the current values of the first and second scaling factors to comparison circuitry implemented on the memory controller; and
comparing, at the given one of the plurality of periodic intervals, the current values of the first and second scaling factors to respective historical values of the first and second scaling factor.

20. The method as recited in claim 19, further comprising inhibiting performance of the calibration if each of the current values of the first and second scaling factors are within a specified range based on their respective historical values.

* * * * *